US011084391B2

(12) United States Patent
Rasmussen (10) Patent No.: US 11,084,391 B2
(45) Date of Patent: Aug. 10, 2021

(54) CHARGING STATION COMPRISING MULTIPLE BATTERIES FOR CHARGING ELECTRICAL VEHICLES

(71) Applicant: Nerve Smart Systems, APS, Roskilde (DK)

(72) Inventor: Jesper B. Rasmussen, Birkerød (DK)

(73) Assignee: NERVE SMART SYSTEMS, APS, Roskilde (DK)

( * ) Notice: Subject to any disclaimer, the term of this patent is extended or adjusted under 35 U.S.C. 154(b) by 265 days.

(21) Appl. No.: 16/341,560

(22) PCT Filed: Oct. 9, 2017

(86) PCT No.: PCT/DK2017/050334
§ 371 (c)(1),
(2) Date: Apr. 12, 2019

(87) PCT Pub. No.: WO2018/072799
PCT Pub. Date: Apr. 26, 2018

(65) Prior Publication Data
US 2020/0122596 A1    Apr. 23, 2020

Related U.S. Application Data

(63) Continuation of application No. PCT/DK2017/050334, filed on Oct. 9, 2017.

(30) Foreign Application Priority Data

Oct. 18, 2016  (DK) ............................. PA201670819

(51) Int. Cl.
*B60L 53/00*  (2019.01)
*B60L 53/62*  (2019.01)
(Continued)

(52) U.S. Cl.
CPC .............. *B60L 53/62* (2019.02); *B60L 50/64* (2019.02); *B60L 53/53* (2019.02); *B60L 53/66* (2019.02);
(Continued)

(58) Field of Classification Search
CPC .......... B60L 53/62; B60L 53/53; B60L 53/66; B60L 53/31; B60L 50/64; B60L 58/12;
(Continued)

(56) References Cited

U.S. PATENT DOCUMENTS 5,202,617 A   4/1993  Nor
5,744,936 A   4/1998  Kawakami
(Continued)

FOREIGN PATENT DOCUMENTS

| DE | 102005000979 A1 | 7/2006 |
| DE | 102010023049 A1 | 12/2011 |

(Continued)

*Primary Examiner* — Naum Levin
(74) *Attorney, Agent, or Firm* — Fox Rothschild LLP; Carol E. Thorstad-Forsyth (57) ABSTRACT

A charging station for charging electrical vehicles and comprising battery pack(s). The battery pack(s) comprise(s) batteries coupled in series and a control unit for controlling the batteries individually. Each battery (1) comprises battery cell(s) with a battery inlet line and a battery outlet line, an electrical circuit element arranged to lead from the battery inlet line to the battery outlet line to form an electrical path leading around the battery cell, and one switch. The switch is arranged in the battery outlet line or the battery inlet line and is switchable between first and second positions. The control unit is connected to the switch of each battery and is adapted for controlling the switch to switch between the first position, in which an electrical power is lead through the battery cell, and the second position, in which the electrical power is lead through the electrical circuit element.

8 Claims, 6 Drawing Sheets

(51) Int. Cl.
*B60L 50/64* (2019.01)
*B60L 53/53* (2019.01)
*B60L 53/66* (2019.01)
*B60L 58/12* (2019.01)
*H02J 7/00* (2006.01)
*H01M 10/42* (2006.01)
*H01M 10/44* (2006.01)
*H01M 10/46* (2006.01)
*H02J 7/02* (2016.01)

(52) U.S. Cl.
CPC .......... *B60L 58/12* (2019.02); *H01M 10/425* (2013.01); *H01M 10/4207* (2013.01); *H01M 10/441* (2013.01); *H01M 10/46* (2013.01); *H02J 7/005* (2020.01); *H02J 7/0013* (2013.01); *H02J 7/0045* (2013.01); *H02J 7/0048* (2020.01); *H02J 7/02* (2013.01); *H01M 2010/4271* (2013.01); *H01M 2220/10* (2013.01); *H01M 2220/20* (2013.01); *H02J 2207/20* (2020.01)

(58) Field of Classification Search
CPC ........ H02J 7/0048; H02J 7/005; H02J 7/0013; H02J 7/0045; H02J 7/02; H02J 2207/20; H01M 10/4207; H01M 10/425; H01M 10/441; H01M 10/46; H01M 2010/4271; H01M 2220/10; H01M 2220/20; Y02T 90/12

See application file for complete search history.

(56) References Cited

U.S. PATENT DOCUMENTS

| | | | |
|---|---|---|---|
| 7,705,491 B2 * | 4/2010 | King | B60L 58/26 307/80 |
| 8,928,174 B2 | 1/2015 | Muto et al. | |
| 9,168,841 B2 * | 10/2015 | Kawai | H02J 7/0027 |
| 9,222,985 B2 | 12/2015 | Kang et al. | |
| 2010/0261043 A1 | 10/2010 | Kim et al. | |
| 2011/0140535 A1 | 6/2011 | Choi et al. | |
| 2011/0285345 A1 * | 11/2011 | Kawai | H02J 7/045 320/107 |
| 2012/0013180 A1 | 1/2012 | Muto et al. | |
| 2013/0249317 A1 | 9/2013 | Kang et al. | |
| 2014/0197684 A1 | 7/2014 | Masato et al. | |
| 2016/0036251 A1 | 2/2016 | Ma | |
| 2016/0118819 A1 * | 4/2016 | Chatroux | B60L 3/0046 320/112 |

FOREIGN PATENT DOCUMENTS

| | | |
|---|---|---|
| DE | 102013005104 A1 | 10/2014 |
| DE | 102015200276 A1 | 7/2016 |
| WO | 96/22625 A1 | 7/1996 |
| WO | 2014145756 A1 | 9/2014 |
| WO | 2015017896 A1 | 2/2015 |

* cited by examiner

CHARGING STATION COMPRISING MULTIPLE BATTERIES FOR CHARGING ELECTRICAL VEHICLES

RELATED APPLICATION DATA

The present application is the U.S. National Phase of International Patent Application No. PCT/DK2017/050334, filed on Oct. 9, 2017 and entitled "CHARGING STATION FOR CHARGING ELECTRICAL VEHICLES," which claims priority to Denmark Patent Application No. PA 201670819, filed on Oct. 18, 2016 and entitled "CHARGING STATION FOR CHARGING ELECTRICAL VEHICLES," the contents of which are incorporated herein by reference in their entireties.

FIELD OF THE INVENTION

The present invention relates to charging stations for charging electrical vehicles. More particularly, the present invention relates to a charging station adapted for charging electrical vehicles and comprising at least one battery pack comprising a first terminal, a second terminal, and a plurality of batteries, the plurality of batteries being coupled in series between the first terminal and the second terminal, electrical coupling means adapted for coupling the first and second terminal of the at least one battery pack to an electrical energy source such as to receive an electrical input power and to an electrical vehicle for delivering an electrical output power to an electrical vehicle, and a control unit adapted for controlling each of the batteries of the plurality of batteries of the battery pack individually. Each battery of said plurality of batteries comprises a battery cell with a negative terminal and a positive terminal, a battery inlet line connected to the negative terminal and a battery outlet line connected to the positive terminal.

It is noted that the term "electrical vehicle" as used herein encompasses in principle any electrically powered vehicle and particularly electrically powered land vehicles. Examples are vehicles for domestic or industrial transportation, such as a car, a bus, a truck, a lorry, a van, as well as industrial vehicles, such as a forklift, a truck, a hand truck, a rider truck or a pallet lifter. Further examples include electrically powered vehicles in the form of sea vessels such as boats and ships.

BACKGROUND OF THE INVENTION

Current types of electrical vehicles may be charged using the voltages normally received from an external source, such as the ordinary grid. Furthermore, recent developments point towards that the voltage needed to charge upcoming types and models of electrical vehicles is significantly higher than the voltages normally received from an external source, such as the ordinary grid. Also, the voltage needed to charge an electrical vehicle, whether of a current or upcoming type, varies with the state of charge of the battery of the electrical vehicle, and possibly also with other factors such as e.g. the type of battery. Thus, the result is that charging stations for charging electrical vehicles, irrespective of whether the vehicles are of current or upcoming types, generally require the use of high power electronics, which is expensive.

Traditional charging stations for charging electrical vehicles receives a power having one pre-defined voltage from a source of electrical energy. To obtain the specific voltage needed for charging the electrical vehicle in a given situation the prior art charging stations therefore comprise an AC-DC converter circuit for converting the AC power received form the grid to a DC power and a DC-DC converter circuit with associated high power electronics. These two circuits may be built together or be two separate circuits. Hence, the prior art charging stations comprise a significant amount of expensive high power electronics.

As the number of electric vehicles used in domestic and public transportation as well as in industrial applications are continuously increasing, there is a generally increasing demand for charging stations for charging electrical vehicles, and in particular charging stations for charging electrical vehicles which are cost efficient in manufacture. Furthermore, it is desirable to provide a charging station for charging electrical vehicles which enables charging the batteries of the electrical vehicles in a fast, efficient, safe and not least cost efficient manner. Furthermore, there is a desire for providing a solution that also causes less load on the electric grid.

Therefore, more recently developed types of charging stations for charging electrical vehicles are provided with internal batteries or battery packs. With such charging stations it becomes possible to lower the stress or load on the external source of electrical energy, particularly the grid, and it becomes possible to deliver a maximum output voltage, V(max), of the charging station being lager than the voltage, V(ext), delivered by the external source of electrical energy. Finally, such charging stations makes DC to DC charging possible as the DC output of the battery pack may be delivered or fed directly to the battery of the electrical vehicle to be charged.

EP 2 660 924 A2 discloses a device for managing a battery system which comprises a plurality of battery cells connected in series, a performance measurement section for measuring a performance of each of the battery cells, a cell switching section for turning on or off a connection of each battery cell to other battery cells, and a controlling section for comparing the performance of each battery cell measured by the performance measurement section with a reference performance and, in the presence of the battery cell(s) having measured performance lower than the reference performance, controlling the cell switching section to interrupt the connection of the relevant battery cell(s) to other battery cells. However, when used as an electrical vehicle charging system, at least one extra high power electronic component, in particular at least one extra DC-DC converter, is required to be arranged between the battery system and an electrical vehicle to be charged in order or the charging system to deliver the correct current to the electrical vehicle. Indeed, this is the case for most prior art solutions.

For example, WO 2014/145756 discloses an all-purpose charging system with one or more battery packs, each comprising a plurality of energy storage units, and each energy storage unit being associated with a switch module, the switch module being connected to the input and output terminal of the energy storage unit. The energy storage devices with their respective switch modules are serially coupled. The switch module comprises 2n+2 switches, where n is 1 or more, or in other words at least four switches, enabling coupling of the battery in one of a number of states, including reversing the polarity of the output voltage and bypassing an energy storage unit, needed in the various applications for which this charging system is intended.

Both above-mentioned prior art solutions are, however, highly complex and require a large number of components, including a large amount of high power electronics, if they are to be rendered usable for charging electrical vehicles, and thus do not meet the above objects.

Also, charging stations for electrical vehicles are often to be placed at remote locations, which makes maintenance expensive as a technician must travel long distances to get to the charging station. Therefore, such highly complex solutions, which may be more prone to malfunctioning, are not desirable in charging stations for electrical vehicles.

It is therefore the object of the invention to provide a charging station for charging electrical vehicles which is simple in construction and cost efficient in both manufacture and maintenance. A further object is to provide such a charging station which also enables charging the batteries of the electrical vehicles in a fast, efficient, safe and not least cost efficient manner. A still further object is to provide a charging station for charging electrical vehicles that also provides less load on the electric grid.

SHORT DESCRIPTION OF THE INVENTION

According to the invention, this is obtained by means of a charging station adapted for charging electrical vehicles, the charging station comprising:

at least one battery pack comprising a first terminal, a second terminal, and a plurality of batteries, the plurality of batteries being coupled in series between the first terminal and the second terminal, electrical coupling means adapted for coupling the first and second terminal of the at least one battery pack to an electrical energy source such as to receive an electrical input power and to an electrical vehicle for delivering an electrical output power to an electrical vehicle, and a control unit adapted for controlling each of the batteries of the plurality of batteries of the battery pack individually, where each battery of said plurality of batteries comprises:

a battery cell with a negative terminal and a positive terminal, a battery inlet line connected to the negative terminal and a battery outlet line connected to the positive terminal, an electrical circuit element arranged to lead from the battery inlet line to the battery outlet line such as to form an electrical path leading around the battery cell, and one switch, the one switch being arranged in one of the battery outlet line, and thus between the positive terminal of the battery cell and the electrical circuit element, and the battery inlet line, and thus between the negative terminal of the battery cell and the electrical circuit element, and the one switch being switchable between a first position, in which the one switch connects the positive terminal and the battery outlet line or in which the one switch connects the negative terminal and the battery inlet line, and a second position, in which the one switch connects the electrical circuit element and the battery outlet line or in which the one switch connects the electrical circuit element and the battery inlet line, where the control unit is connected to the respective one switch of each battery of said plurality of batteries and is adapted for controlling the one switch of each battery of said plurality of batteries to switch between the first position, in which an electrical power is lead through the battery cell corresponding to the battery being in an active state, and the second position, in which the electrical power is lead through the electrical circuit element and around the battery cell corresponding to the battery being in a passive state, such as to enable individual switching of each battery of the plurality of batteries between the active state and the passive state, and where each battery of said plurality of batteries further comprises one further switch and thus two switches in total, the one further switch being arranged in the other one of the battery outlet line, and thus between the positive terminal of the battery cell and the electrical circuit element, and the battery inlet line, and thus between the negative terminal of the battery cell and the electrical circuit element, and the control unit being connected to the respective one further switch of each battery of said plurality of batteries and being adapted for controlling the one further switch of each battery of said plurality of batteries to switch between the first position and the second position simultaneously with the one switch such as to enable individual switching of each battery of the plurality of batteries between the active state and the passive state.

By providing an electrical circuit element arranged to lead from the battery inlet line to the battery outlet line such as to form an electrical path leading around the battery cell, and one switch arranged in one of the battery outlet line and the battery inlet line, a charging station with very simple and cost efficient circuitry is provided for. In particular, the need for high power electronics as in all types of traditional charging stations is limited considerably, and the need for complex switching circuitry as in the solution of WO 2014/145756 is avoided altogether. Thus, the risk of the charging station malfunctioning is lowered considerably. Also, such a charging station is very cost efficient in manufacture and thus also to acquire.

By providing the one switch to be switchable between a first position, in which the one switch connects the positive terminal and the battery outlet line or in which the one switch connects the negative terminal and the battery inlet line, and a second position, in which the one switch connects the electrical circuit element and the battery outlet line or in which the one switch connects the electrical circuit element and the battery inlet line, it is made possible to couple any given single battery into or out of the battery pack circuit separately. Thereby a charging station is provided which makes it possible to couple out any one battery in case of a malfunction, and which may still be kept running by using the remaining batteries of the battery pack. Thus, the risk of the charging station malfunctioning is lowered considerably, allowing the time necessary for the technician to arrive and repair the charging station. In other words, such a charging station is very cost efficient also in use and maintenance.

Furthermore, the provision of the electrical circuit element and the one switch as described above makes it possible to charge an electrical vehicle with power at voltages above the voltage, V(ext), delivered by the external source of electrical energy, and at least up to the maximum output voltage, V(max), of the battery pack, to continuously lower the output voltage of the charging station to match the state of charge of the battery of the electrical vehicle being charged, and, as the output of the battery pack is a DC voltage, enables DC to DC charging. Thus such a charging station enables charging the batteries of the electrical vehicles in a fast, efficient, safe and not least cost efficient manner.

By providing that the control unit is connected to the respective one switch of each battery of said plurality of batteries and is adapted for controlling the one switch of each battery of said plurality of batteries to switch between the first position, in which an electrical power is lead through the battery cell corresponding to the battery being in an active state, and the second position, in which the electrical power is lead through the electrical circuit element and around the battery cell corresponding to the battery being in a passive state, such as to enable individual switching of each battery of the plurality of batteries between the active state and the passive state, a charging station is provided with which the control of the switches and thus the batteries may be very precise, both when charging and discharging the batteries. Thereby, the life time of the batteries of the charging station is increased considerably. In other words, the risk of the charging station malfunctioning is lowered even further, and the cost efficiency is thus raised. Furthermore, quick and precise continuous adaptation of the output voltage of the charging station to voltage needed by the electrical vehicle may be obtained. Also, the time needed to charge an electrical vehicle is optimized, and the life time of the battery of the electrical vehicle may even be increased, thus enabling charging the batteries of the electrical vehicles in a fast, efficient, safe and not least cost efficient manner.

Each battery of said plurality of batteries further comprises one further switch and thus two switches in total, the one further switch being arranged in the other one of the battery outlet line, and thus between the positive terminal of the battery cell and the electrical circuit element, and the battery inlet line, and thus between the negative terminal of the battery cell and the electrical circuit element, and the control unit being connected to the respective one further switch of each battery of said plurality of batteries and being adapted for controlling the one further switch of each battery of said plurality of batteries to switch between the first position and the second position simultaneously with the one switch such as to enable individual switching of each battery of the plurality of batteries between the active state and the passive state.

Thereby, an improved safety of the switching process and thus the batteries is provided for in that both switches must be operated to switch the battery between the active state and the passive state while still keeping the needed number of high power electronic components to a minimum.

In an embodiment the control unit furthermore is adapted for receiving or obtaining a signal from a battery cell of at least one the plurality of batteries, the signal comprising information regarding the state of charge of the battery cell, and for controlling the one switch, and where provided the one further switch, of each of the batteries of the at least one battery pack in dependence of the signal received such that the voltage of the electrical input power delivered to the batteries matches the voltage needed for charging the batteries.

Thereby, a high degree of precision and certainty in the process of charging the batteries of the battery pack is provided for, which in turn enables avoiding potentially damaging or even detrimental overcharging or excess discharging of the batteries. This in turn enables quick and efficient charging of the batteries of the battery pack, which in turn results in a lowered power consumption and increased life time of the batteries. Furthermore, the batteries of the battery pack may in this way be controlled by the control unit in such a way that an even charging or discharging of all batteries is achieved.

In an embodiment the control unit furthermore is adapted for receiving or obtaining a signal from a battery cell of at least one the plurality of batteries, the signal comprising information indicating that one or more batteries are defective, and for controlling the one switch, and where provided the one further switch, of each of the batteries of the at least one battery pack in dependence of the signal received such that a battery indicated as defective is permanently switched to the passive state.

Thereby the charging station may be kept running even if one (or for that matter more) batteries of the battery pack is defective. Thereby a charging station which is cheaper in maintenance and has a longer life time and more uptime is provided for.

It may furthermore be provided for that when a technician has repaired or exchanged a defective battery, he may couple back in the battery at the charging station, e.g. by means of a suitable device for operating the control unit to couple the said battery back in, or alternatively from a central control station to which the control unit, possibly together with control units of other charging stations, is connected wirelessly or wired.

Likewise, the control unit may also be adapted for sending a signal to a central control station or another suitable control device to provide the central control station or other suitable control device with information regarding the charging station, e.g. regarding a defective battery in the charging station.

Other functionalities, such as e.g. monitoring of the charging station's power consumption and/or the number of vehicles charged at the charging station over time, and communication regarding specific charging procedures such as identifying the user, payment functionalities and actuation and termination of the charging procedure, may also be built into the control unit and be controlled from a central control station or by means of another suitable control device.

In an embodiment the charging station further comprises a plurality of battery packs, the control unit being adapted for controlling the one switch, and where provided the one further switch, of each of the batteries of the plurality of batteries of each of the plurality of battery packs individually.

Thereby, both a higher maximum output voltage and a more detailed tuning of the magnitude of the output voltage to the voltage needed by the electrical vehicle may be obtained, depending on the number of battery cells and the capacity of the battery cells.

In an embodiment the control unit furthermore is adapted for receiving or obtaining a signal from an electrical vehicle to be charged, the signal comprising information regarding any one or more of the voltage needed for charging the electrical vehicle, the state of charge of a battery of the electrical vehicle and the capacity of the battery of the electrical vehicle, and controlling the one switch, and where provided the one further switch, of each of the batteries of the at least one battery pack in dependence of the signal received such that the voltage of the electrical output power delivered matches the voltage needed for charging the electrical vehicle and/or is chosen taking into account any one or more of the state of charge of a battery of the electrical vehicle and the capacity of the battery of the electrical vehicle.

Thereby, several parameters may be taken into account when charging the electrical vehicle such as to enable delivering exactly the desired voltage at all times, which in turn provides for a charging process being even faster and more efficient, and in particular being very lenient for the battery of the electrical vehicle to be charged.

The electrical power received from an external source of electrical power at the first and second terminal of the battery pack may be an AC power. In an embodiment the charging station may therefore further comprise a rectifier arranged at or before the first terminal of the battery pack for converting the received AC power to a DC power such as to enable delivering a DC power to the at least one battery pack.

Alternatively, the electrical power received from an external source of electrical power at the first and second terminal of the battery pack may be a DC power.

In an embodiment the electrical coupling means comprises an input power bus and an output power bus, the input power bus being adapted for connection to an external source of electrical power, such as the grid, and the battery pack, or each battery pack of the plurality of battery packs, being adapted for connection to the input power bus, and the output power bus being adapted for connection to an electrical vehicle to be charged, and the battery pack, or each battery pack of the plurality of battery packs, being adapted for connection to the output power bus.

Thereby a charging station with a particularly simple circuitry for connection of especially multiple battery packs to obtain a common voltage output is provided for, which in turn helps keeping down the manufacturing costs.

In an embodiment the battery pack, or each battery pack of the plurality of battery packs, further comprises two switches adapted and arranged for switching the first and second terminal of the battery pack, or of each battery pack of the plurality of battery packs, at least between being coupled to the input power bus and to the output power bus and optionally also being coupled into a neutral position.

Thereby a charging station with a particularly simple circuitry for not only switching battery packs between being charged and discharged but, if a neutral position is also provided for, even for coupling out an entire battery pack by is provided for, which in turn helps keeping down the manufacturing costs.

In an embodiment the control unit furthermore is adapted for controlling the two switches adapted and arranged for switching the first and second terminal of the battery pack, or of each battery pack of the plurality of battery packs, between being coupled to the input power bus and to the output power bus.

SHORT DESCRIPTION OF THE DRAWINGS

The invention will be described in more detail below by means of a non-limiting example of a presently preferred embodiment and with reference to the schematic drawings, in which.

DETAILED DESCRIPTION OF THE INVENTION

Like reference numerals refer to like elements throughout. Particularly, for the components of a battery of a battery pack of a charging station according to the invention, the first digit of the reference numeral refers to the component, while the second digit refers to the number of the battery amongst the plurality of batteries comprised in the battery pack. By way of example, the reference numeral 23 refers to the battery cell 2 of the third battery in the battery pack, while the reference numeral 6*n* refers to the switch 6 of the nth battery in the battery pack.

Figure 1:
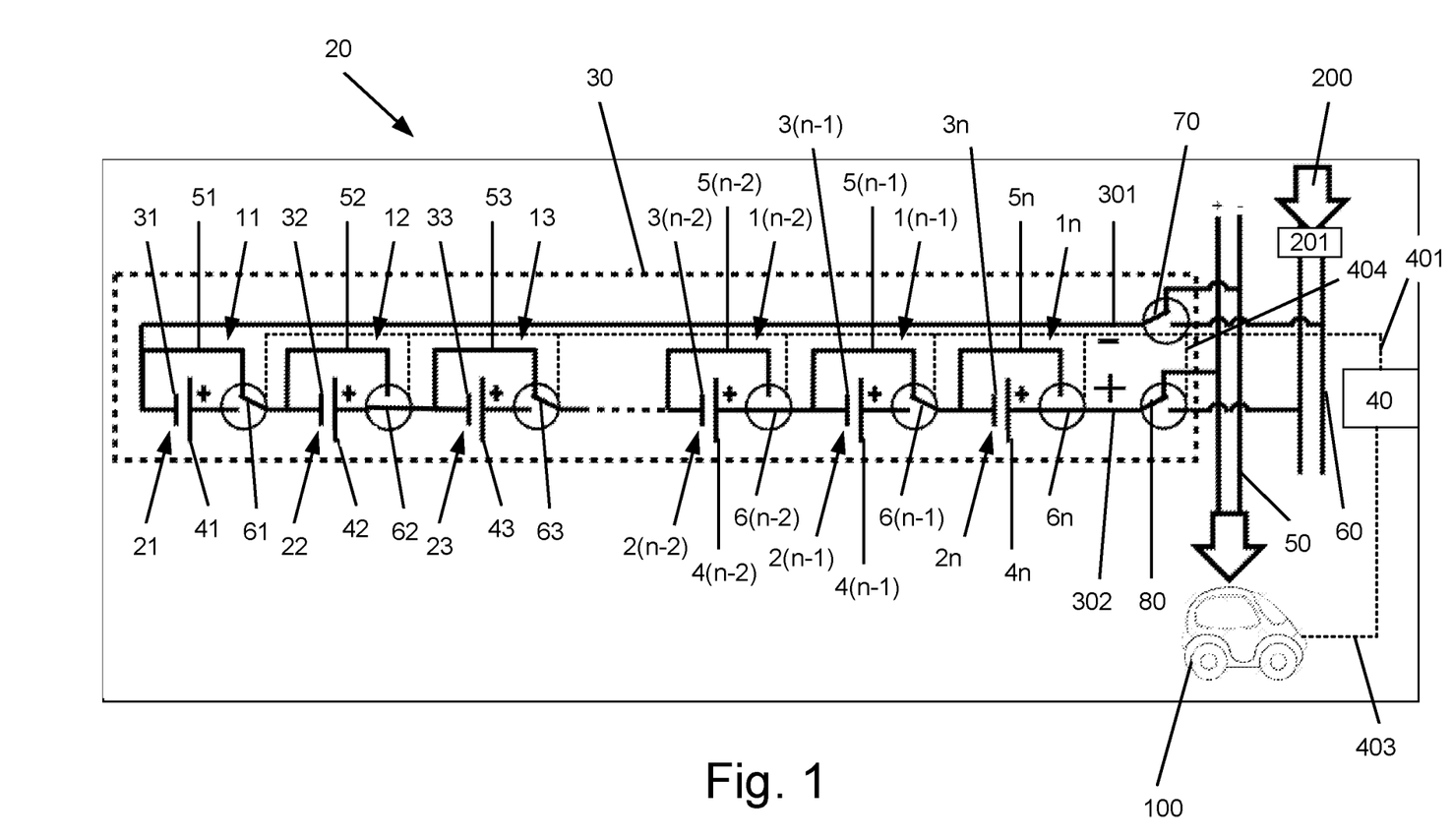
FIG. 1 shows a principle diagram illustrating a first embodiment of a charging station for charging electrical vehicles according to the invention and comprising one battery pack with a plurality of batteries.

FIG. 1 illustrates a first embodiment of a charging station 20 for charging electrical vehicles 100 according to the invention. The charging station 20 generally comprises a battery pack 30 with a plurality of n batteries 11, 12, 13, . . . 1(*n*−2), 1(*n*−1), 1*n*. The number n of batteries in a battery pack may be any number greater than or equal to 2. The batteries 11, 12, 13, . . . 1(*n*−2), 1(*n*−1), 1*n* are connected in series. The batteries 11, 12, 13, . . . 1(*n*−2), 1(*n*−1), 1*n* are all constructed in the same manner and will be described further below.

The battery pack 30 further comprises a first terminal 301 connected on one side to the negative terminal 31 of the battery cell 21 of the first battery 11 in the battery pack. The first terminal 301 thus forms a negative terminal of the battery pack. The first terminal 301 may on the other side be connected directly or indirectly to either an external source of electrical energy 200 or to an electrical vehicle 100 to be charged. A switch 70 is provided to switch the first terminal 301 between the external source of electrical energy 200 or the electrical vehicle 100 to be charged. The switch 70 is thus of the type having two positions. The switch 70 may in some embodiments further be provided to switch the first terminal 301 between the external source of electrical energy 200, the electrical vehicle 100 to be charged and a neutral position. The switch 70 may thus in such an embodiment be of the type having three possible positions.

The external source of electrical energy 200 may be any suitable source such as the ordinary electrical grid (i.e. mains) or may be one or more solar cells or panels or one or more wind turbines. The external source of electrical energy 200 may be an AC source or a DC source, and may be two-phased or three-phased, an example being a three-phased 230 V or 400 V AC mains. The electrical vehicle 100 may as described initially be any feasible type of electrical vehicle, and in particular electrical land vehicle. If the external source of electrical energy 200 is an AC source, a rectifier 201 may be provided between the external source of electrical energy 200 and the battery pack 30.

The battery pack 30 further comprises a second terminal 302 connected on one side to the positive terminal 4n of the battery cell 2n of the nth and last battery 1n in the battery pack. The second terminal 302 may on the other side be connected directly or indirectly to either an external source of electrical energy 200 or to an electrical vehicle 100 to be charged. A switch 80 is provided to switch the second terminal 302 between the external source of electrical energy 200 or the electrical vehicle 100 to be charged. The switch 80 is thus of the type having two positions. The switch 80 may in some embodiments further be provided to switch the second terminal 302 between the external source of electrical energy 200, the electrical vehicle 100 to be charged and a neutral position. The switch 80 may thus in such an embodiment be of the type having three possible positions.

Figure 2:
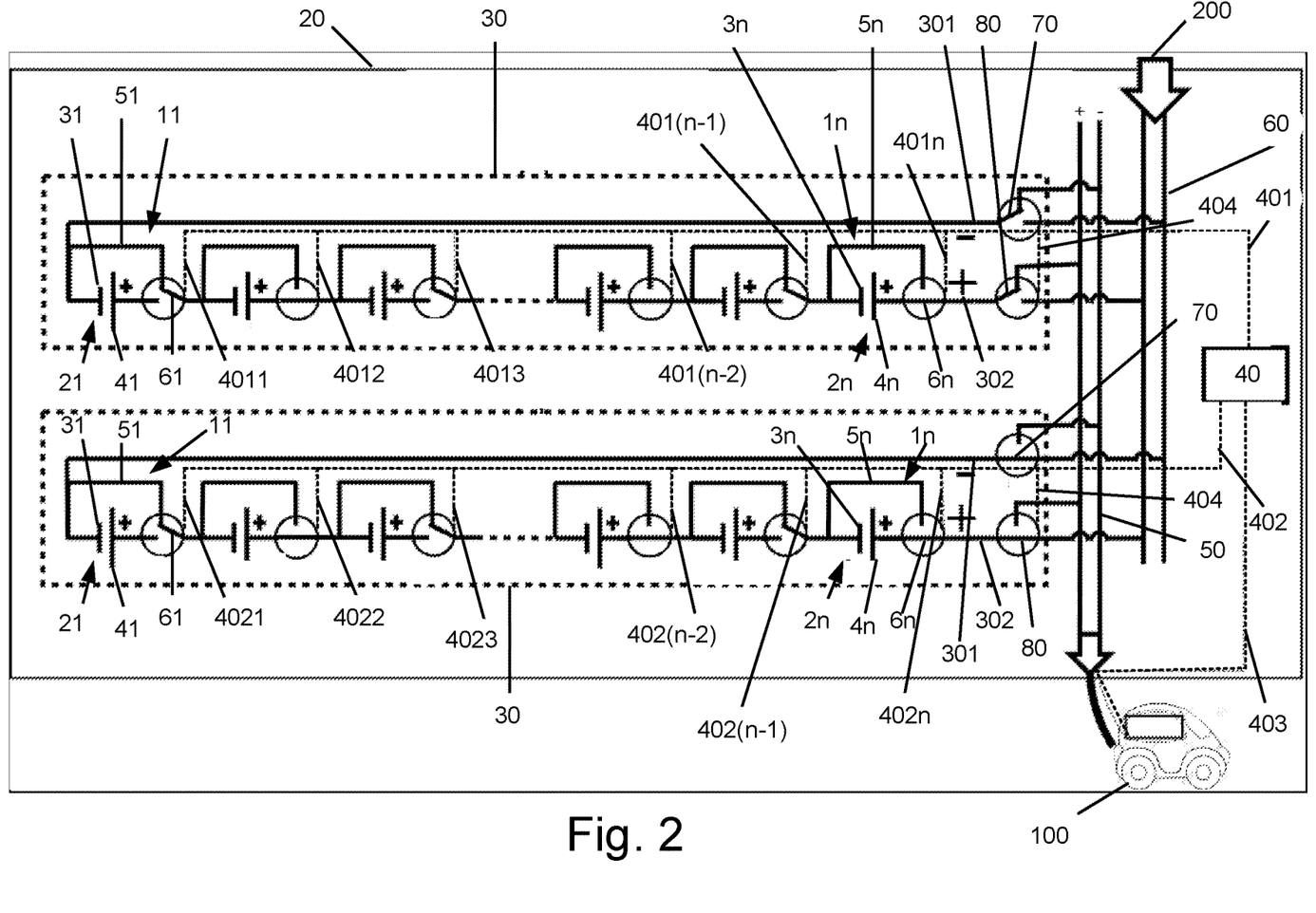
FIG. 2 shows a principle diagram illustrating a second embodiment of a charging station for charging electrical vehicles according to the invention and comprising two battery packs, each with a plurality of batteries.

In the embodiments shown the charging station 20 comprises electrical coupling means in the form of an input power bus 60 and an output power bus 50. The first terminal 301 and the second terminal 302 may be connected to the external source of electrical energy 200 via the input power bus 60 or may be connected to the electrical vehicle 100 to be charged via the output power bus 50. Other suitable electrical coupling means include electrical plugs and sockets and for the connection to external source of electrical energy 200 even an electrical line, where such connection means may be provided together with or instead of the power buses mentioned above.

With reference also to FIGS. 6 to 9, the construction of each of the batteries 1, 11, 12, 13, ... 1(n–2), 1(n–1), 1n of the battery pack 30 will now be described. Each battery has the same construction. Each battery comprises a single battery cell 2, 21, 22, 23, ... 2(n–2), 2(n–1), 2n with a negative terminal 3, 31, 32, 33, ... 3(n–2), 3(n–1), 3n and a positive terminal 4, 41, 42, 43, ... 4(n–2), 4(n–1), 4n, an electrical circuit element 5, 51, 52, 53, ... 5(n–2), 5(n–1), 5n forming a bypass around the battery cell and a single switch 6, 61, 62, 63, ... 6(n–2), 6(n–1), 6n. The battery cells 2, 21, 22, 23, ... 2(n–2), 2(n–1) may have the same nominal voltage or may have different capacities. For instance, the battery cells 2, 21, 22, 23, ... 2(n–2), 2(n–1) may be Li-ion battery cells.

For the sake of simplicity, the components of each of the batteries 1 will in the following description be referred to only by means of the reference numerals used in FIGS. 6 to 9, i.e. without using the second digit.

The electrical circuit element 5 is arranged between the battery inlet line 8 and the battery outlet line 9 such as to form an electrical path, or in other words a bypass, leading around the battery cell 2. The switch 6 is in the embodiment shown on FIGS. 6 and 7 arranged in the battery outlet line 9 such as to enable switching the battery outlet line 9 between being connected to the positive terminal 4 of the battery cell 2 and to the electrical circuit element 5. Alternatively, in the embodiment shown on FIGS. 8 and 9, the switch, now denoted 7, may be arranged in the battery inlet line 8 such as to enable switching the battery inlet line 8 between being connected to the negative terminal 3 of the battery cell 2 and the electrical circuit element 5.

Figure 6:
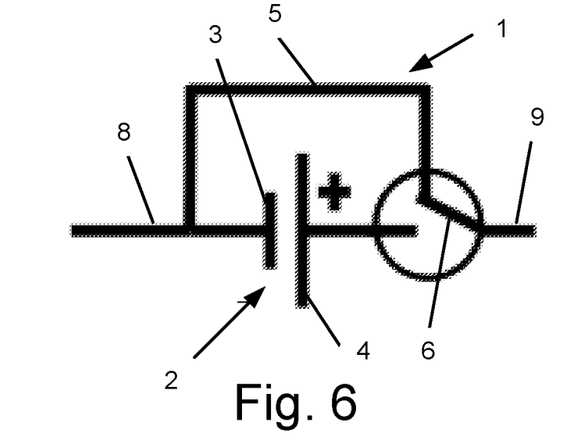
FIGS. 6 and 7 shows a principle diagram illustrating a battery of a battery pack of a charging station for charging electrical vehicles according to the invention, the battery being switched into the passive state and the active state, respectively.
Figure 7:
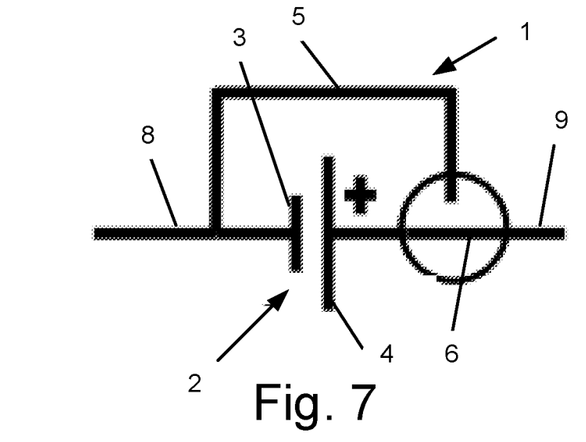

FIGS. 6 and 7 show the two coupling states of the switch 6. As shown in FIG. 6, the switch 6 may in one switching state be positioned to form an electrical path from the battery inlet line 8 through the electrical circuit element 5 and to the battery outlet line 9, thus switching the battery 2 in a passive state. Thereby the battery 2 is bypassed. As shown in FIG. 7, the switch 6 may alternatively in another switching state be positioned to form an electrical path from the battery inlet line 8 through the battery cell 2 and to the battery outlet line 9, thus switching the battery 2 in an active state. Thereby the battery 2 may be used to contribute to the electrical output of the charging station 20 delivered to the electrical vehicle 100 or the battery 2 may be charged, depending on whether the battery pack 30 is coupled to the electrical vehicle 100 or the external power source 200, i.e. in the embodiment show depending on the position of the switches 70 and 80.

Figure 8:
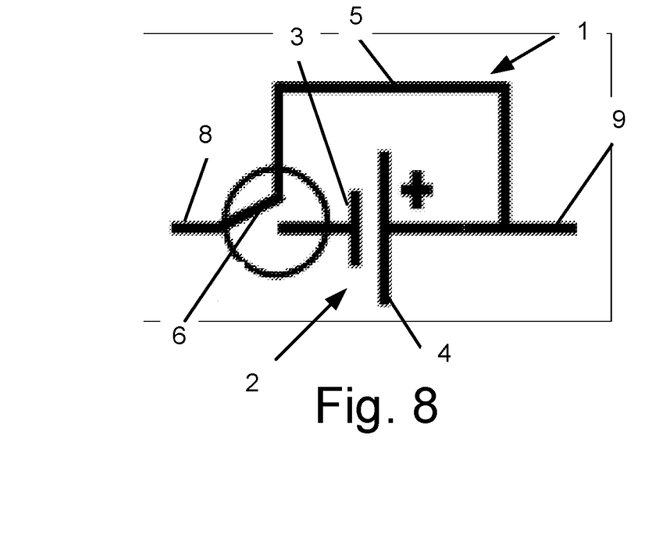
FIGS. 8 and 9 shows a principle diagram illustrating an alternative embodiment of a battery of a battery pack of a charging station for charging electrical vehicles according to the invention, the battery being switched into the passive state and the active state, respectively.
Figure 9:
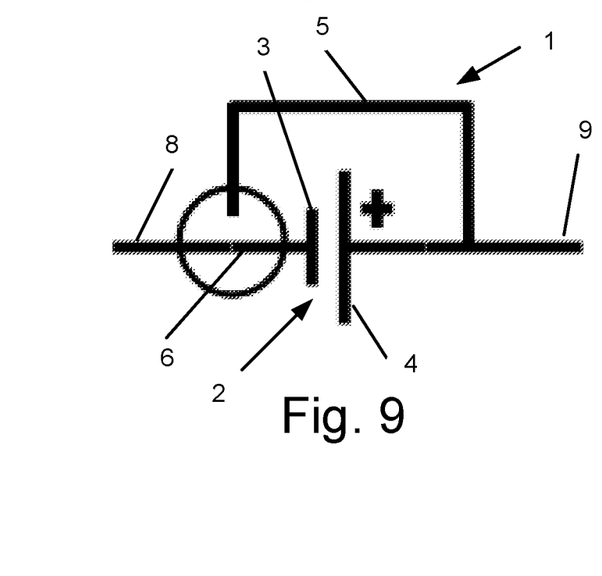

Analogously, FIGS. 8 and 9 show the two coupling states of the switch 7. As shown in FIG. 8, the switch 7 may in one switching state be positioned to form an electrical path from the battery inlet line 8 through the electrical circuit element 5 and to the battery outlet line 9, thus switching the battery 2 in a passive state. Thereby the battery 2 is bypassed. As shown in FIG. 9, the switch 7 may alternatively in another switching state be positioned form an electrical path from the battery inlet line 8 through the battery cell 2 and to the battery outlet line 9, thus switching the battery 2 in an active state. Thereby the battery 2 may be used to contribute to the electrical output of the charging station 20 delivered to the electrical vehicle 100 or the battery 2 may be charged, depending on whether the battery pack 30 is coupled to the electrical vehicle 100 or the external power source 200, i.e. in the embodiment show depending on the position of the switches 70 and 80.

Referring again to FIG. 1, the charging station 20 further comprises a control unit 40. The control unit 40 serves to control each of the batteries 11 to 1n of the plurality of batteries of the battery pack 30 individually. The control unit 40 is therefore connected to the respective one switch 61 to 6n of each battery 11 to 1n of the battery pack 30 such as to enable the control unit 40 to control the one switch 61 to 6n of each battery 11 to 1n to switch the corresponding battery between the active state and the passive state. Referring also to FIG. 2, the control unit 40 is more particularly connected to the respective one switch 61 to 6n of each battery 11 to 1n by means of a connection line 401 providing connections 4011 to 401n (cf. FIG. 2) to each one of the switches 61 to 6n. Thereby individual switching of each battery 11 to 1n between the active state and the passive state is enabled.

By means of the connection line 401 the control unit 40 may receive or obtain signals from any one or more battery cells 21 to 2n of the plurality of batteries 11 to 1n. Thereby the control unit 40 may control the switching state of the batteries 11 to 1n of the battery pack 30 in dependence of the signals received such that the voltage of the electrical input power delivered to the batteries matches the voltage needed for charging the batteries and/or that a battery indicated as defective is permanently switched to the passive state. The signals received by the control unit 40 may for instance be signals indicating the state of charge of the battery and/or the temperature of the battery, where a temperature being above a set threshold value indicating a defective battery. Thus, a voltage sensor and/or a temperature sensor may be provided at each of the batteries 11 to 1n, the control unit 40 being adapted to receive signals from the sensors, or the control unit 40 may be adapted for measuring on the batteries 11 to 1n directly.

A further connection 404 provided by the connection line 401 may be provided to connect the control unit 40 to the switches 70 and 80. Thereby the control unit may also control the coupling of the battery pack 30 between a state in which at least one or some of the battery cells 21 to 2n are charged, and a state in which an electrical vehicle 100 connected to the charging station 20 is charged and at least one or some of the battery cells 21 to 2n thus are discharged and optionally also a state in which the battery pack 30 is bypassed corresponding to the switches 70 and 80 being in a neutral position. To this end the control unit 40 controls the switches 70 and 80 in a simultaneous manner.

The connection line 401 with connections 4011 to 401$n$ and 404 is on the figures shown as dotted lines intended to illustrate that the connection line 401 may both be formed as a wired connection and be formed as a wireless connection. Thus, the switches 61 to 6$n$ as well as the switches 70 and 80 may be adapted for remote actuation or for direct actuation.

A further connection 403 may be provided to connect the control unit 40 to an electrical vehicle to be charged. The connection 403 may advantageously be a wireless connection, but could in principle also be a wired connection, e.g. an electrical line.

Thereby, the control unit 40 furthermore may receive or obtain a signal from an electrical vehicle 100 to be charged, and control the batteries 11 to 1$n$ of the battery pack 30 in dependence of the signal received such that the voltage of the electrical output power delivered by the charging station 20 matches the voltage needed for charging the electrical vehicle 100 and/or is chosen taking into account any one or more of the state of charge of a battery of the electrical vehicle 100 and the capacity of the battery of the electrical vehicle 100.

As shown in FIG. 2 a charging station 20 according to the invention may also comprise more than one battery pack 30 each being of the general construction described above and each comprising a plurality of batteries 11 to 1$n$ of the general construction described above. As illustrated, by way of example the charging station 20 may comprise two battery packs 30. The control unit 40 then serves to control each of the batteries 11 to 1$n$ of the plurality of batteries of each of the plurality of battery packs 30 individually. Therefore, the control unit 40 comprises a plurality of connection lines, one for each battery pack. As illustrated, by way of example the control unit 40 comprises two connection lines 401 and 402, respectively, each with connections 4011 to 401$n$ and 4021 to 402$n$, respectively, to each switch 61 to 6$n$ of each battery 11 to 1$n$ of the respective battery packs 30.

Figure 3:
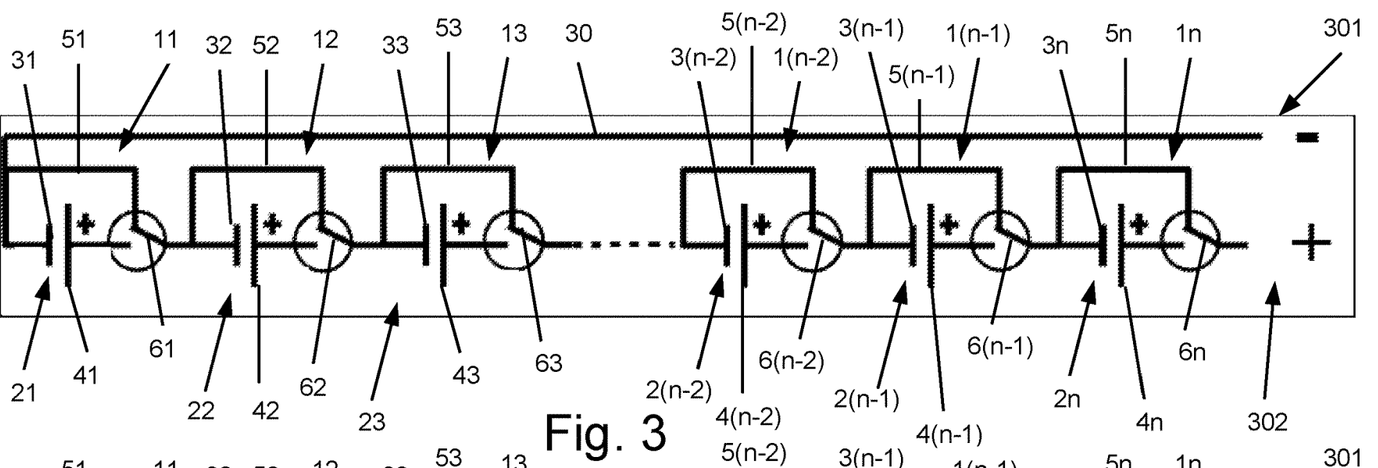
FIG. 3 shows a principle diagram illustrating a battery pack of a charging station for charging electrical vehicles according to the invention, all batteries of the battery pack being switched into the passive state.
Figure 4:
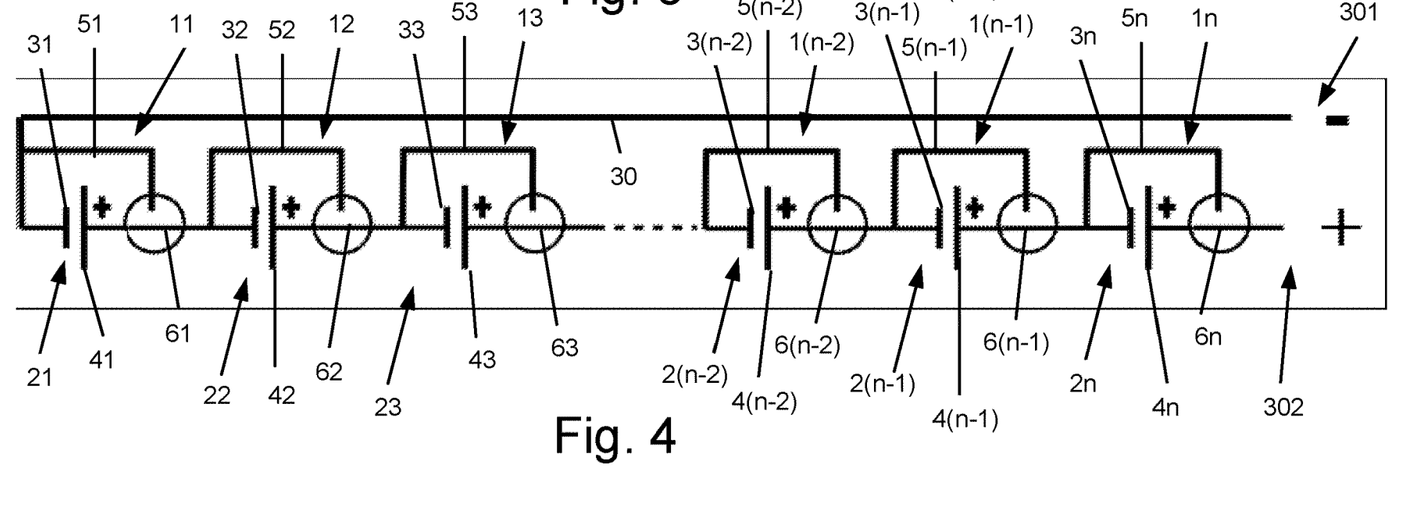
FIG. 4 shows a principle diagram illustrating the battery pack of FIG. 3 with all batteries being switched into the active state.
Figure 5:
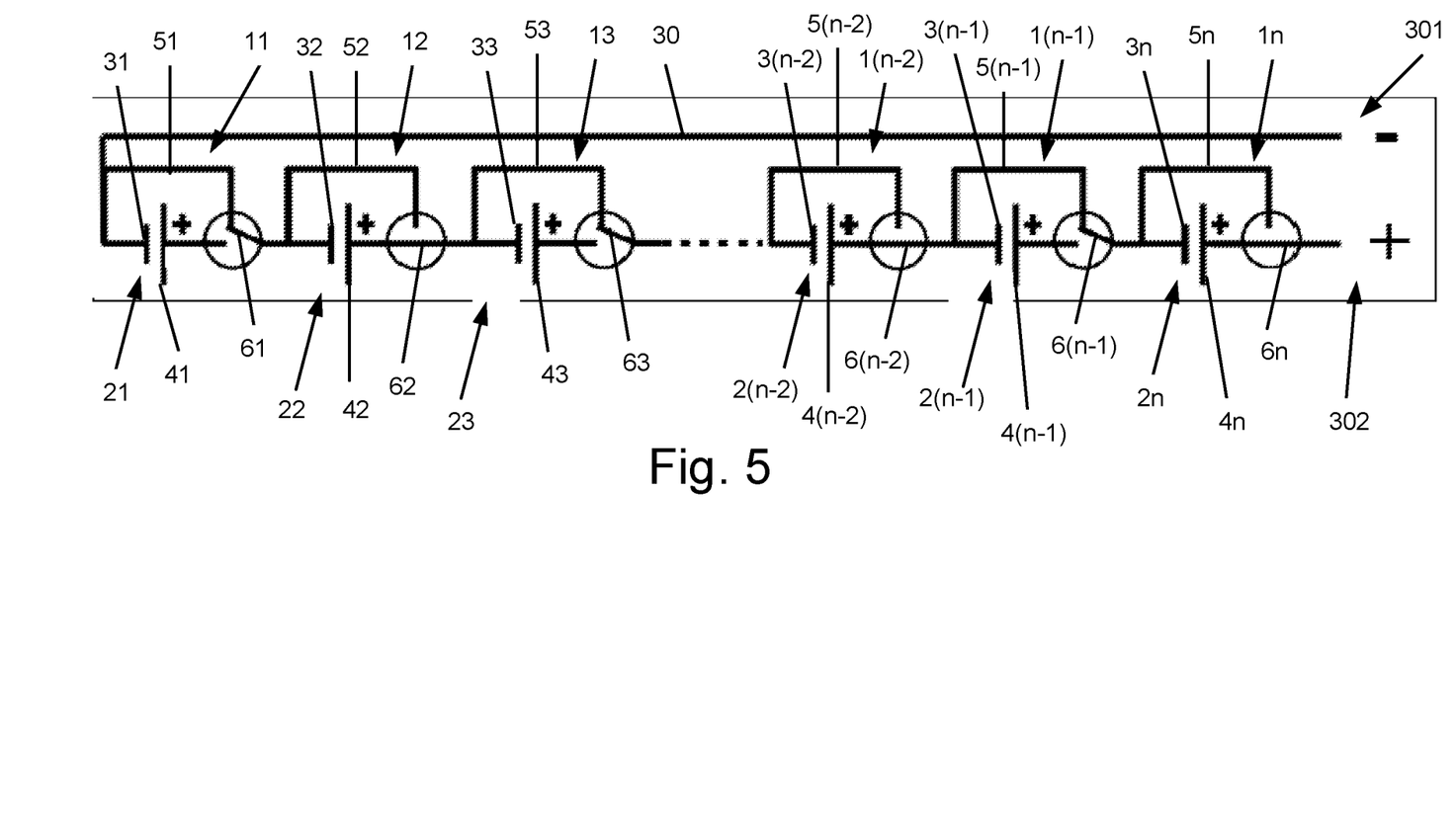
FIG. 5 shows a principle diagram illustrating the battery pack of FIG. 3 with some batteries being switched into the active state and some batteries being switched into the passive state.

Turning now to FIGS. 3 to 5, different possible switching states of the individual batteries 11 to 1$n$ of a battery pack 30 of a charging station 20 according to the invention is shown.

FIG. 3 illustrates a battery pack 30 in which all batteries 11 to 1$n$ are switched in the passive state. Thus, the battery pack 30 delivers the minimum possible output voltage, V(min)=0 V. The battery pack 30 is effectively turned off. None of the batteries 11 to 1$n$ are charged or discharged.

FIG. 4 illustrates a battery pack 30 in which all batteries 11 to 1$n$ are switched in the active state. Thus, the battery pack 30 delivers the maximum possible output voltage, V(max). Or alternatively all batteries 11 to 1$n$ are charged or discharged simultaneously.

FIG. 5 illustrates a battery pack 30 in which only some of the batteries, namely batteries 11, 13 and 1($n$−1), are switched in the passive state, while the remaining batteries, namely batteries 12, 1($n$−2) and 1$n$, are switched in the active state. Thus, the battery pack 30 delivers an output voltage, V, comprising contributions from the batteries switched in the active state, i.e. batteries 12, 1($n$−2) and 1$n$. Thus, the output voltage V is between 0 V and V(max). Or alternatively only batteries 12, 1($n$−2) and 1$n$ are charged simultaneously.

The number of batteries 11 to 1$n$ of the battery pack 30 being switched to the active state may be chosen, e.g. by means of the control unit 40, as desired or needed such as to regulate the output voltage of the battery pack and thus the charging station, e.g. in response to signals received by the control unit 40.

Thus, by controlling which batteries are in the active state and which are in the passive state, it becomes possible to control the exact output voltage of the charging station to, in principle, any voltage between 0 and V(max), although the number of possible values depend on the nominal voltage of the battery cell of the respective batteries of the battery pack. It also becomes possible during charging of the batteries 11 to 1$n$ to switch any one battery to the passive state as soon as it is fully charged, thus avoiding overcharge of the batteries 11 to 1$n$.

Figure 10:
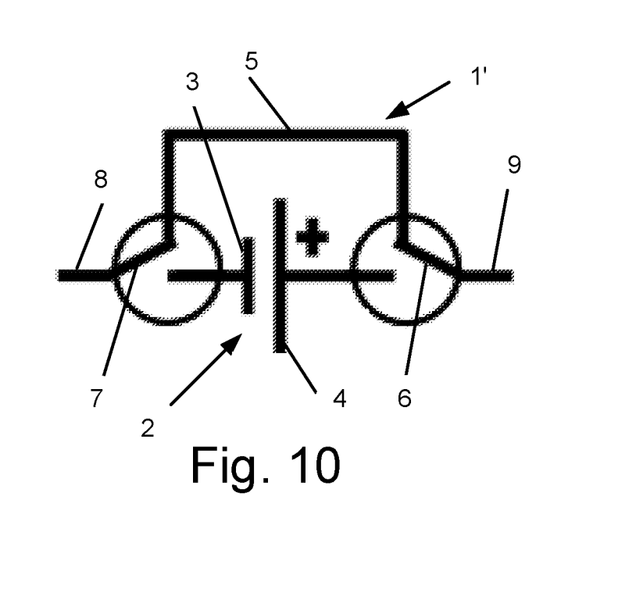
FIGS. 10 and 11 shows a principle diagram illustrating an alternative embodiment of a battery of a battery pack of a charging station for charging electrical vehicles according to the invention, the battery comprising two switches and being switched into the passive state and the active state, respectively.
Figure 11:
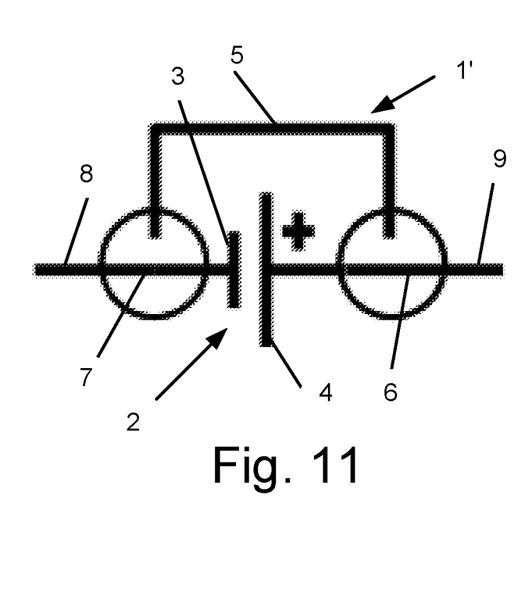

Turning finally to FIGS. 10 and 11, a second embodiment of a battery 1' of a battery pack 30 of a charging station 20 according to the invention is shown in the passive state and the active state, respectively. The battery 1' differs from the battery 1 as shown in FIGS. 6 and 7 only in comprising a further switch 7 arranged in the battery inlet line 8, and thus between the negative terminal 3 of the battery cell 2 and the electrical circuit element 5.

The battery 1' in other words comprise two switches 6 and 7, where the switch 6 is arranged in the battery outlet line 9, and thus between the positive terminal 4 of the battery cell 2 and the electrical circuit element 5, and where the switch 7 is arranged in the battery inlet line 8, and thus between the negative terminal 3 of the battery cell 2 and the electrical circuit element 5.

In charging stations 20 with battery packs 30 comprising batteries 1' of the type shown in FIGS. 10 and 11, the control unit 40 is provided a connection line 401, and where more such battery packs are provided for also further connection lines, such as connection line 402, providing connections to both switches 6 and 7 of each battery 1' of the battery pack and thus enabling controlling both switches 6 and 7 of each battery 1' of the battery pack.

Typically, although not shown on the drawing, the charging station 20 further comprises a suitable housing for accommodating the components described herein such as to provide shielding form external influences. Such housings are known per se.

Charging stations according to the invention are typically provided and placed in connection with existing og newly built service stations, service areas, parking lots or spaces and the like, but may also be provided to private households owning an electrical vehicle.

It should be noted that the above description of preferred embodiments serves only as examples, and that a person skilled in the art will know that numerous variations are possible without deviating from the scope of the claims.

The person skilled in the art realizes that the present invention by no means is limited to the preferred embodiments described above. On the contrary, many modifications and variations are possible within the scope of the appended claims.

The invention claimed is:

1. A charging station adapted for charging electrical vehicles, the charging station comprising:
    at least one battery pack comprising a first terminal, a second terminal, and a plurality of batteries, the plurality of batteries being coupled in series between the first terminal and the second terminal,
    electrical coupling means adapted for coupling the first and second terminal of the at least one battery pack to an electrical energy source such as to receive an electrical input power and to an electrical vehicle for delivering an electrical output power to an electrical vehicle, and a control unit adapted for controlling each of the batteries of the plurality of batteries of the battery pack individually, wherein each battery of said plurality of batteries comprises:

a battery cell with a negative terminal and a positive terminal, a battery inlet line connected to the negative terminal and a battery outlet line connected to the positive terminal, an electrical circuit element arranged to lead from the battery inlet line to the battery outlet line such as to form an electrical path leading around the battery cell, and one first switch, the one first switch being arranged in one of the battery outlet line, and thus between the positive terminal of the battery cell and the electrical circuit element, and the battery inlet line, and thus between the negative terminal of the battery cell and the electrical circuit element, and the one first switch being switchable between a first position, in which the one first switch connects the positive terminal and the battery outlet line or in which the one first switch connects the negative terminal and the battery inlet line, and a second position, in which the one first switch connects the electrical circuit element and the battery outlet line or in which the one first switch connects the electrical circuit element and the battery inlet line, wherein the control unit being connected to the respective one first switch of each battery of said plurality of batteries and being adapted for controlling the one first switch of each battery of said plurality of batteries to switch between the first position, in which an electrical power is lead through the battery cell corresponding to the battery being in an active state, and the second position, in which the electrical power is lead through the electrical circuit element and around the battery cell corresponding to the battery being in a passive state, such as to enable individual switching of each battery of the plurality of batteries between the active state and the passive state, and wherein each battery of said plurality of batteries further comprises one second switch and thus two switches in total, the one second switch being arranged in the other one of the battery outlet line, and thus between the positive terminal of the battery cell and the electrical circuit element, and the battery inlet line, and thus between the negative terminal of the battery cell and the electrical circuit element, and wherein the control unit being connected to the respective one second switch of each battery of said plurality of batteries and being adapted for controlling the one second switch of each battery of said plurality of batteries to switch between the first position and the second position simultaneously with the one first switch such as to enable individual switching of each battery of the plurality of batteries between the active state and the passive state.

2. The charging station according to claim 1, wherein the control unit furthermore is adapted for:

receiving or obtaining a signal from a battery cell of at least one of the plurality of batteries, the signal comprising information regarding the state of charge of the battery cell and/or information indicating that one or more batteries are defective, and controlling the one first switch, and the one second switch, of each of the batteries of the at least one battery pack in dependence of the signal received such that the voltage of the electrical input power delivered to the batteries matches the voltage needed for charging the batteries and/or that a battery indicated as defective is permanently switched to the passive state.

3. The charging station according to claim 1, and comprising a plurality of battery packs, the control unit being adapted for controlling the one first switch, and the one second switch, of each of the batteries of the plurality of batteries of each of the plurality of battery packs individually.

4. The charging station according to claim 1, wherein the control unit furthermore is adapted for:

receiving or obtaining a signal from an electrical vehicle to be charged, the signal comprising information regarding any one or more of the voltage needed for charging the electrical vehicle, the state of charge of a battery of the electrical vehicle and the capacity of the battery of the electrical vehicle, and controlling the one first switch, and the one second switch, of each of the batteries of the at least one battery pack in dependence of the signal received such that the voltage of the electrical output power delivered matches the voltage needed for charging the electrical vehicle and/or is chosen taking into account any one or more of the state of charge of a battery of the electrical vehicle and the capacity of the battery of the electrical vehicle.

5. The charging station according to claim 1, wherein the electrical power received from an external source of electrical power at the first and second terminal of the battery pack is an AC power, and wherein the charging station further comprises a rectifier arranged at or before the first terminal of the battery pack for converting the received AC power to a DC power such as to enable delivering a DC power to the at least one battery pack.

6. The charging station according to claim 1, wherein the electrical coupling means comprises an input power bus and an output power bus, the input power bus being adapted for connection to an external source of electrical power, and the battery pack, or each battery pack of the plurality of battery packs, being adapted for connection to the input power bus, and the output power bus being adapted for connection to an electrical vehicle to be charged, and the battery pack, or each battery pack of the plurality of battery packs, being adapted for connection to the output power bus.

7. The charging station according to claim 6, wherein the battery pack, or each battery pack of the plurality of battery packs, further comprises two switches adapted and arranged for switching the first and second terminal of the battery pack, or of each battery pack of the plurality of battery packs, at least between being coupled to the input power bus and to the output power bus, and optionally also being coupled into a neutral position.

8. The charging station according to claim 7, wherein the control unit furthermore is adapted for controlling the two switches adapted and arranged for switching the first and second terminal of the battery pack, or of each battery pack of the plurality of battery packs, between being coupled to the input power bus and to the output power bus.

* * * * *